United States Patent
Li et al.

(10) Patent No.: US 12,308,795 B2
(45) Date of Patent: May 20, 2025

(54) OSCILLATION CIRCUIT AND CIRCUIT SYSTEM USING THE SAME

(71) Applicant: NUVOTON TECHNOLOGY CORPORATION, Hsinchu (TW)

(72) Inventors: Cheng-Tao Li, Zhubei (TW); Ping-Wen Lai, Zhubei (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 22 days.

(21) Appl. No.: 18/543,269

(22) Filed: Dec. 18, 2023

(65) Prior Publication Data

US 2025/0047242 A1 Feb. 6, 2025

(30) Foreign Application Priority Data

Jul. 31, 2023 (TW) .................................. 112128603

(51) Int. Cl.
*H03B 5/24* (2006.01)
*H03K 3/037* (2006.01)

(52) U.S. Cl.
CPC ............... *H03B 5/24* (2013.01); *H03K 3/037* (2013.01)

(58) Field of Classification Search
CPC ......... H03B 5/24; H03K 3/037; H03K 3/0231
See application file for complete search history.

(56) References Cited

U.S. PATENT DOCUMENTS

| | | | | |
|---|---|---|---|---|
| 7,034,627 B1* | 4/2006 | Kudari | ................. | H03K 3/0231 331/111 |
| 7,884,679 B2* | 2/2011 | Mahooti | .............. | H03K 3/0231 331/70 |
| 8,665,029 B2* | 3/2014 | Tseng | ................... | H03K 3/0231 331/111 |
| 2021/0349489 A1* | 11/2021 | Conte | ...................... | G05F 3/30 |

* cited by examiner

*Primary Examiner* — Jeffrey M Shin
(74) *Attorney, Agent, or Firm* — MUNCY, GEISSLER, OLDS & LOWE, P.C.

(57) ABSTRACT

An oscillation circuit includes: a current mirror circuit outputting a reference current; a charging and discharging circuit charging a first charge storage element by using one of the reference currents or discharging the first charge storage element, to generate a first control voltage; an output stage circuit including a first switch transistor controlled by the first control voltage to output a first oscillation signal; a first resistor; a second resistor; and a diode circuit. The first resistor and the second resistor have same directional temperature drifts, a first resistance of the first resistor is greater than a second resistance of the second resistor, and a first resistance drift of the first resistor with a temperature variation is smaller than a second resistance drift of the second resistor with the temperature variation, such that the effect of the temperature variation on a frequency accuracy is reduced.

10 Claims, 3 Drawing Sheets

OSCILLATION CIRCUIT AND CIRCUIT SYSTEM USING THE SAME

CROSS-REFERENCE TO RELATED APPLICATION

This application claims the priority from the TW patent application No. 112128603, filed on Jul. 31, 2023, and all contents of such TW Patent Application are included in the present disclosure.

BACKGROUND

1. Field of the Invention

The present disclosure is related to an oscillation circuit and a circuit system using the oscillation circuit, in particular to, an oscillation circuit which can reduce the effect of the temperature variation on its frequency accuracy and a circuit system using the oscillation circuit.

2. Description of the Related Art

Existing oscillation circuits are required to achieve accurate frequency drift in their applications. The frequency of an output signal of most oscillation circuits is related to passive components (e.g., resistors and capacitors), and thus the frequency accuracy problem is limited by the passive components such as resistors and capacitors. However, in some processes, the temperature drift of resistors is very large, and no two types of passive components with different temperature directions are available to be used. For example, all resistors have positive temperature drifts or negative temperature drifts, that is, the resistor with positive temperature drift and the resistor with negative temperature drift do not present in the processes at the same time.

Common poly resistors may have negative temperature drifts in older processes, and resistors made up of other materials have positive temperature drifts. Thus, zero temperature drift may be achieved by using the resistors with different temperature drifts in series, which makes the frequency of the output signal generated by the oscillator circuit not having temperature drift. However, in advanced processes, poly resistors have positive temperature drifts, and resistors made up of other materials have positive temperature drifts as well, which results in the impossibility to use the resistors in series to achieve zero temperature drift. In view of this, a new oscillation circuit architecture is needed. The effect of temperature compensation may be achieved even if the passive components are in the same temperature direction, thereby achieving the requirement of accurate frequency drift.

SUMMARY

It can be understood from the above description that the present disclosure is to provide a new oscillation circuit architecture. The effect of temperature compensation may be achieved even if the passive components are in the same temperature direction, thereby achieving the requirement of accurate frequency drift. In some embodiments, the effect of zero temperature drift may even be achieved.

To address the above issues, embodiments of the present disclosure provide an oscillation circuit including a current mirror circuit, a charging and discharging circuit, an output stage circuit, a first resistor, a second resistor and a diode circuit. The current mirror circuit has a plurality of current output terminals, some of the plurality of current output terminals configured for outputting a plurality of reference currents, respectively. The charging and discharging circuit is electrically connected to a first current output terminal of the plurality of current output terminals and includes a first charge storage element, wherein the charging and discharging circuit is controlled by a control signal to charge the first charge storage element by using one of the reference currents or discharge the first charge storage element, to generate a first control voltage. The output stage circuit includes a first switch transistor, the first switch transistor electrically connected to a second current output terminal of the plurality of current output terminals and the charging and discharging circuit, the first switch transistor being controlled by the first control voltage to output a first oscillation signal. Two terminals of the first resistor are respectively electrically connected to a third current output terminal of the plurality of current output terminals and a low voltage. One terminal of the second resistor is electrically connected to a fourth current output terminal of the plurality of current output terminals. Two terminals of the diode circuit are respectively electrically connected to the other terminal of the second resistor and the low voltage. The first resistor and the second resistor have same directional temperature drifts, a first resistance of the first resistor is greater than a second resistance of the second resistor, and a first resistance drift of the first resistor with a temperature variation is smaller than a second resistance drift of the second resistor with the temperature variation.

Based on the above purposes, embodiments of the present disclosure further provide a circuit system including the aforementioned oscillation circuit and a functional circuit. The functional circuit is electrically connected to the oscillation circuit and configured for performing a corresponding function based on the first oscillation signal of the oscillation circuit.

To sum up, according to the oscillation circuit provided above, the technical problem of decline in frequency accuracy of the oscillation circuit caused by temperature drift may be reduced. In addition, since the frequency accuracy of the oscillation circuit is efficiently improved, for the circuit system using the oscillation circuit provided above, the probability of malfunction of the circuit system caused by temperature drift is also greatly reduced, thereby improving the operating accuracy and stability of the circuit system.

BRIEF DESCRIPTION OF THE DRAWINGS

The drawings are provided to make the persons with ordinary knowledge in the field of the art further understand the present disclosure, and are incorporated into and constitute a part of the specification of the present disclosure. The drawings illustrate demonstrated embodiments of the present disclosure, and are used to explain the principal of the present disclosure together with the description of the present disclosure.

DESCRIPTION OF THE PREFERRED EMBODIMENTS

To address the above technical problems, embodiments of the present disclosure mainly provide an oscillation circuit including a current mirror circuit, a charging and discharging circuit, an output stage circuit, a first resistor, a second resistor and a diode circuit. The current mirror circuit outputs a reference current. The charging and discharging circuit charges a first charge storage element by using one of the reference currents or discharges the first charge storage element, to generate a first control voltage. The output stage circuit includes a first switch transistor. The first switch transistor is controlled by the first control voltage to output a first oscillation signal. The first resistor and the second resistor have same directional temperature drifts, for example, both of the first resistor and the second resistor are resistors with positive temperature coefficient, or both of the first resistor and the second resistor are resistors with negative temperature coefficient. In order to reduce the effect of temperature variation on the frequency accuracy, a first resistance of the first resistor is designed to be greater than a second resistance of the second resistor, and a first resistance drift of the first resistor with a temperature variation is designed to be smaller than a second resistance drift of the second resistor with the temperature variation. In addition, embodiments of the present disclosure also provide a circuit system that uses the above-mentioned oscillator circuit to reduce the probability of malfunction of the circuit system caused by temperature drift.

Figure 1:
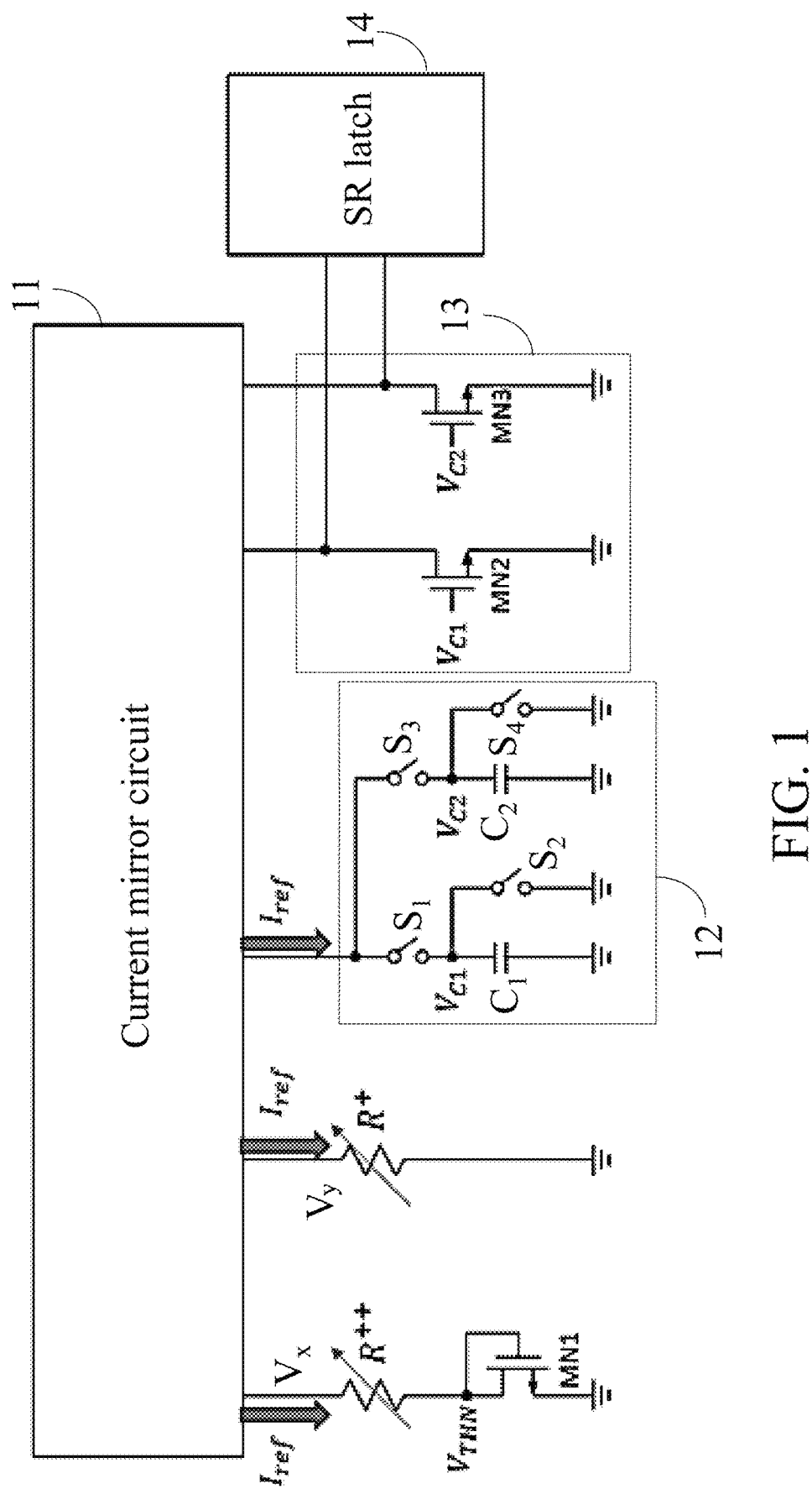
FIG. 1 is a schematic circuit diagram illustrating an oscillation circuit according to an embodiment of the present disclosure.

First, please refer to FIG. 1. FIG. 1 is a schematic circuit diagram illustrating an oscillation circuit according to an embodiment of the present disclosure. The oscillation circuit includes a current mirror circuit 11, a charging and discharging circuit 12, an output stage circuit 13, a first resistor $R^+$, a second resistor $R^{++}$, a diode circuit (implemented by a first N-type transistor MN1 in this embodiment), and a buffer output circuit (implemented by an SR latch 14 in this embodiment). The current mirror circuit 11 has a plurality of current output terminals, some of the plurality of current output terminals configured for outputting a plurality of reference currents $I_{ref}$, respectively. The charging and discharging circuit 12 is electrically connected to a first current output terminal of the plurality of current output terminals of the current mirror circuit 11 and includes a first charge storage element (implemented by a first capacitor $C_1$), wherein the charging and discharging circuit 12 is controlled by a control signal (such as multiple signals for respectively controlling a first switch $S_1$, a second switch $S_2$, a third switch $S_3$ and a fourth switch $S_4$) to charge the first charge storage element by using the reference current $I_{ref}$ or discharge the first charge storage element, to generate a first control voltage $V_{C1}$.

The output stage circuit 13 includes a first switch transistor (implemented by a second N-type transistor MN2 in this embodiment), the first switch transistor electrically connected to a second current output terminal of the plurality of current output terminals of the current mirror circuit 11 and the charging and discharging circuit 12, the first switch transistor being controlled by the first control voltage $V_{C1}$ to output a first oscillation signal. Two terminals of the first resistor $R^+$ are respectively electrically connected to a third current output terminal of the plurality of current output terminals of the current mirror circuit 11 and a low voltage (e.g., ground voltage). One terminal of the second resistor $R^{++}$ is electrically connected to a fourth current output terminal of the plurality of current output terminals of the current mirror circuit 11. Two terminals of the diode circuit are respectively electrically connected to the other terminal of the second resistor $R^{++}$ and the low voltage. The first resistor $R^+$ and the second resistor $R^{++}$ have same directional temperature drifts. For example, each of the first resistor $R^+$ and the second resistor $R^{++}$ has a positive temperature drift (e.g., a resistor with a positive temperature coefficient), or each of the first resistor $R^+$ and the second resistor $R^{++}$ has a negative temperature drift (e.g., a resistor with a negative temperature coefficient). In addition, the first resistor $R^+$ and the second resistor $R^{++}$ may be poly resistors, or resistors made up of materials different to each other, but the present disclosure is not limited thereto. In addition, the buffer output circuit is electrically connected to the output stage circuit 13 and for receiving the first oscillation signal and the second oscillation signal and outputting a clock signal. It should be noted that the buffered output circuit may be an optional component of the oscillation circuit and may be removed.

In this embodiment, the current mirror circuit 11 is designed such that the voltage $V_x$ on the fourth current output terminal is equal to the voltage $V_y$ on the third current output terminal, i.e., $V_x = V_y$. The turn-on voltage of the diode circuit is designed to be $V_{THN}$. Thus, the reference current $I_{ref}$ may be expressed as $$I_{ref} = \frac{V_X - V_{THN}}{R^{++}} = \frac{V_Y}{R^+} = \frac{V_{THN}}{R^+ - R^{++}}.$$

The voltage $V_x$ on the third current output terminal may be expressed as $$V_X = \frac{R^+}{R^+ - R^{++}} \cdot V_{THN}.$$

When the first N-type transistor MN1 and the second N-type transistor MN2 have the same size, the frequency of the first oscillation signal may be expressed as $$f = \left(\frac{2 \cdot C \cdot V_C}{I_{ref}} + 2 \cdot t_d\right)^{-1} = \left(\frac{2 \cdot C \cdot V_{THN}}{\frac{V_{THN}}{R^+ - R^{++}}} + 2 \cdot t_d\right)^{-1} =$$
$$(2 \cdot C \cdot (R^+ - R^{++}) + 2 \cdot t_d)^{-1}.$$

C is the capacitor value of the first charge storage element. $V_C$ is the voltage value of the first control voltage. $t_d$ is the delay time caused by the resistor and capacitor. Thus, in order to reduce the effect of the temperature variation on the frequency accuracy, the first resistance of the first resistor $R^+$ should be designed to be greater than the second resistance of the second resistor $R^{++}$. The first resistance drift of the first resistor $R^+$ with a temperature variation may be designed to be smaller than the second resistance drift of the second resistor $R^{++}$ with the temperature variation. Further, in order to achieve zero temperature drift, the resistance ratio of the first resistor $R^+$ to the second resistor $R^{++}$ may be designed to be equal to the resistance drift ratio of the second resistance drift to the first resistance drift. That is, assuming that $R^+:R^{++}=X:1$ and that the second resistance drift to the first resistance drift respectively are $\pm Z$ and $\pm Y$, then $R^+:R^{++}=X:1=Z:Y$.

Further, in this embodiment, the charging and discharging circuit 12 may further include a second charge storage element (implemented by a second capacitor $C_2$), and the output stage circuit 13 may further include a second switch transistor (implemented by a third N-type transistor MN3), wherein the charging and discharging circuit 12 is further controlled by the control signal to charge the second charge storage element by using the reference current $I_{ref}$ or discharge the second charge storage element, to generate a second control voltage $V_{C2}$. The second switch transistor is electrically connected to a fifth current output terminal of the plurality of current output terminals of the current mirror circuit 11 and the charging and discharging circuit 12, the second switch transistor being controlled by the second control voltage $V_{C2}$ to output a second oscillation signal. The control signal includes a first control signal and a second control signal that are inverted to each other. In this embodiment, the first control voltage $V_{C1}$ is equal to the second control voltage $V_{C2}$, i.e., $V_C = V_{C1} = V_{C2}$. The capacitor value of the second charge storage element is equal to the capacitor value of the first charge storage element, i.e., $C_1 = C_2 = C$. The first N-type transistor MN1, the second N-type transistor MN3, and the third N-type transistor MN3 have the same size.

In addition, the manner of controlling charging and discharging in the charging and discharging circuit may be implemented by providing multiple switches. The multiple switches may include the first switch $S_1$, the second switch $S_2$, the third switch $S_3$, and the fourth switch $S_4$. Two terminals of the first switch $S_1$ are respectively electrically connected to the first current output terminal and a first terminal of the first charge storage element, wherein a second terminal of the first charge storage element is electrically connected to the low voltage. Two terminals of the second switch $S_2$ are respectively electrically connected to the first terminal of the first charge storage element and the low voltage. Two terminals of the third switch $S_3$ are respectively electrically connected to the first current output terminal and a first terminal of the second charge storage element, wherein a second terminal of the second charge storage element is electrically connected to the low voltage. Two terminals of the fourth switch $S_4$ are respectively electrically connected to the first terminal of the second charge storage element and the low voltage. The control signal includes the first control signal and the second control signal. The first switch $S_1$ and the fourth switch $S_4$ are controlled by the first control signal, and the second switch $S_2$ and the third switch $S_3$ are controlled by the second control signal.

In addition, the diode circuit may be implemented by a first N-type transistor MN1, the first switch transistor may be implemented by a second N-type transistor MN2, and the second switch transistor may be implemented by a third N-type transistor MN3. A drain of the first N-type transistor MN1 is electrically connected to the other terminal of the second resistor $R^{++}$ and a gate of the first N-type transistor MN1. A source of the first N-type transistor MN1 is electrically connected to the low voltage. A drain of the second N-type transistor MN2 is electrically connected to the second current output terminal, a gate of the second N-type transistor MN2 receives the first control voltage, and a source of the second N-type transistor MN2 is electrically connected to the low voltage. A drain of the third N-type transistor MN3 is electrically connected to the fifth current output terminal, a gate of the third N-type transistor MN3 receives the second control voltage $V_{C2}$, and a source of the third N-type transistor MN3 is electrically connected to the low voltage.

Figure 2:
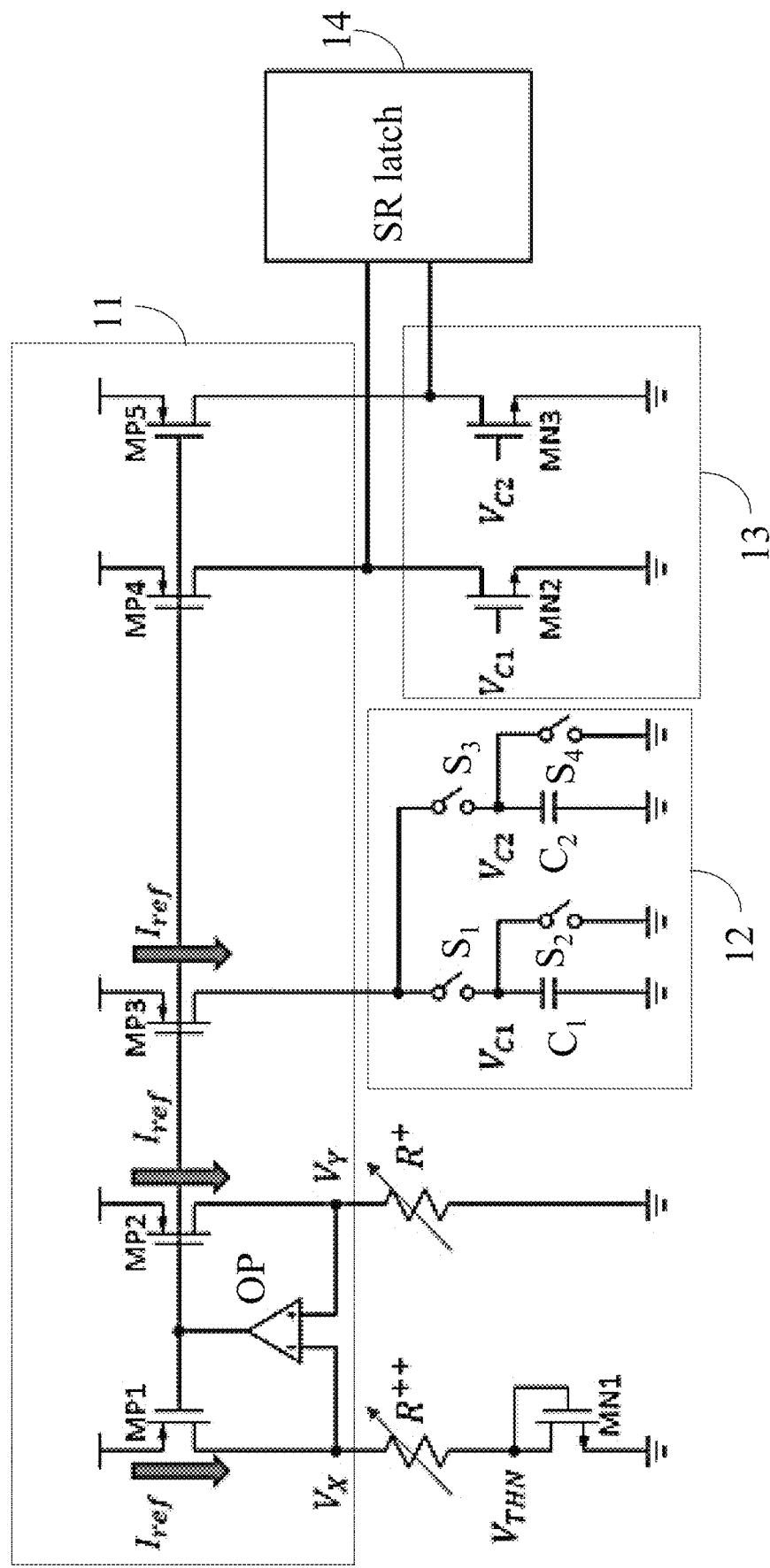
FIG. 2 is a schematic circuit diagram illustrating an oscillation circuit according to another embodiment of the present disclosure.

Further, please refer to FIG. 2. FIG. 2 is a schematic circuit diagram illustrating an oscillation circuit according to another embodiment of the present disclosure. In this embodiment, the current mirror circuit 11 includes a first P-type transistor MP1, a second P-type transistor MP2, a third P-type transistor MP3, a fourth P-type transistor MP4, a fifth P-type transistor MP5, and an operational amplifier OP. A source of the first P-type transistor MP1, a source of the second P-type transistor MP2, a source of the third P-type transistor MP3, a source of the fourth P-type transistor MP4, and a source of the fifth P-type transistor MP5 receive a system voltage. A gate of the first P-type transistor MP1, a gate of the second P-type transistor MP2, a gate of the third P-type transistor MP3, a gate of the fourth P-type transistor MP4, and a gate of the fifth P-type transistor MP5 are electrically connected to each other. A drain of the first P-type transistor MP1, a drain of the second P-type transistor MP2, a drain of the third P-type transistor MP3, a drain of the fourth P-type transistor MP4, and a drain of the fifth P-type transistor MP5 respectively serve as the fourth current output terminal, the third current output terminal, the first current output terminal, the second current output terminal, and the fifth current output terminal. An output terminal of the operational amplifier OP is electrically connected to the gate of the first P-type transistor MP1 and the gate of the second P-type transistor MP2, and an inverting input terminal and a non-inverting input terminal of the operational amplifier OP are respectively electrically connected to the one terminal of the first resistor $R^+$ and the one terminal of the second resistor $R^{++}$.

Figure 3:
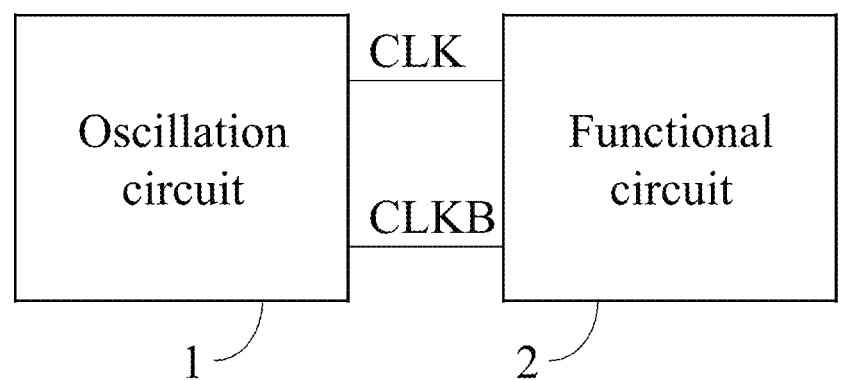
FIG. 3 is a schematic block diagram illustrating a circuit system according to an embodiment of the present disclosure.

Please refer to FIG. 3. FIG. 3 is a schematic block diagram illustrating a circuit system according to an embodiment of the present disclosure. The circuit system includes the oscillation circuit 1 and a functional circuit 2. The oscillation circuit 1 may be the oscillation circuit described in the above embodiments. The functional circuit 2 is electrically connected to the oscillation circuit 1 and is configured for performing corresponding functions based on the first oscillation signal, the second oscillation signal and/or the clock signal of the oscillation circuit.

To sum up, compared with the prior art, the technical solution of the present disclosure address the technical problem that the effect of temperature drift on the frequency accuracy cannot be efficiently eliminated when the passive components have same directional temperature drifts, and the technical solution of the present disclosure may even achieve zero temperature drift.

It should be understood that the examples and the embodiments described herein are for illustrative purpose only, and various modifications or changes in view of them will be suggested to those skilled in the art, and will be included in the spirit and scope of the application and the appendix with the scope of the claims.

What is claimed is:

1. An oscillation circuit, comprising:
   a current mirror circuit, having a plurality of current output terminals, wherein some of the plurality of current output terminals are configured for outputting a plurality of reference currents, respectively;
   a charging and discharging circuit, electrically connected to a first current output terminal of the plurality of current output terminals, the charging and discharging circuit comprising a first charge storage element, wherein the charging and discharging circuit is controlled by a control signal to charge the first charge storage element by using one of the reference currents or discharge the first charge storage element, to generate a first control voltage;

an output stage circuit, comprising a first switch transistor, wherein the first switch transistor is electrically connected to a second current output terminal of the plurality of current output terminals and the charging and discharging circuit, and the first switch transistor is controlled by the first control voltage to output a first oscillation signal;

a first resistor, having two terminals respectively electrically connected to a third current output terminal of the plurality of current output terminals and a low voltage;

a second resistor, having one terminal electrically connected to a fourth current output terminal of the plurality of current output terminals; and a diode circuit, having two terminals respectively electrically connected to the other terminal of the second resistor and the low voltage, wherein the first resistor and the second resistor have same directional temperature drifts, a first resistance of the first resistor is greater than a second resistance of the second resistor, and a first resistance drift of the first resistor with a temperature variation is smaller than a second resistance drift of the second resistor with the temperature variation.

2. The oscillation circuit according to claim 1, wherein both of the first resistor and the second resistor have positive temperature drifts.

3. The oscillation circuit according to claim 1, wherein both of the first resistor and the second resistor have negative temperature drifts.

4. The oscillation circuit according to claim 1, wherein a resistance ratio of the first resistor to the second resistor is equal to a resistance drift ratio of the second resistance drift to the first resistance drift.

5. The oscillation circuit according to claim 1, wherein the charging and discharging circuit further comprises a second charge storage element, and the output stage circuit further comprises a second switch transistor, wherein the charging and discharging circuit is further controlled by the control signal to charge the second charge storage element by using the reference current or discharge the second charge storage element, to generate a second control voltage, the second switch transistor is electrically connected to a fifth current output terminal of the plurality of current output terminals and the charging and discharging circuit, the second switch transistor is controlled by the second control voltage to output a second oscillation signal, and the control signal comprises a first control signal and a second control signal that are inverted to each other.

6. The oscillation circuit according to claim 5, wherein the charging and discharging circuit further comprises:

a first switch, having two terminals respectively electrically connected to the first current output terminal and a first terminal of the first charge storage element, wherein a second terminal of the first charge storage element is electrically connected to the low voltage;

a second switch, having two terminals respectively electrically connected to the first terminal of the first charge storage element and the low voltage;

a third switch, having two terminals respectively electrically connected to the first current output terminal and a first terminal of the second charge storage element, wherein a second terminal of the second charge storage element is electrically connected to the low voltage; and a fourth switch, having two terminals respectively electrically connected to the first terminal of the second charge storage element and the low voltage, wherein the first charge storage element and the second charge storage element respectively are a first capacitor and a second capacitor, the first switch and the fourth switch are controlled by the first control signal, and the second switch and the third switch are controlled by the second control signal.

7. The oscillation circuit according to claim 5, wherein the current mirror circuit comprises:

a first P-type transistor, a second P-type transistor, a third P-type transistor, a fourth P-type transistor, and a fifth P-type transistor, wherein a source of the first P-type transistor, a source of the second P-type transistor, a source of the third P-type transistor, a source of the fourth P-type transistor, and a source of the fifth P-type transistor receive a system voltage, wherein a gate of the first P-type transistor, a gate of the second P-type transistor, a gate of the third P-type transistor, a gate of the fourth P-type transistor, and a gate of the fifth P-type transistor are electrically connected to each other, wherein a drain of the first P-type transistor, a drain of the second P-type transistor, a drain of the third P-type transistor, a drain of the fourth P-type transistor, and a drain of the fifth P-type transistor respectively serve as the fourth current output terminal, the third current output terminal, the first current output terminal, the second current output terminal, and the fifth current output terminal; and an operational amplifier, wherein an output terminal of the operational amplifier is electrically connected to the gate of the first P-type transistor and the gate of the second P-type transistor, and an inverting input terminal and a non-inverting input terminal of the operational amplifier are respectively electrically connected to the one terminal of the first resistor and the one terminal of the second resistor.

8. The oscillation circuit according to claim 5, further comprising:

an SR latch, electrically connected to the output stage circuit and configured for receiving the first oscillation signal and the second oscillation signal and outputting a clock signal.

9. The oscillation circuit according to claim 5, wherein the diode circuit is a first N-type transistor, a drain of the first N-type transistor is electrically connected to the other terminal of the second resistor and a gate of the first N-type transistor, a source of the first N-type transistor is electrically connected to the low voltage, the first switch transistor is a second N-type transistor, a drain of the second N-type transistor is electrically connected to the second current output terminal, a gate of the second N-type transistor is configured for receiving the first control voltage, a source of the second N-type transistor is electrically connected to the low voltage, and the second switch transistor is a third N-type transistor, a drain of the third N-type transistor is electrically connected to the fifth current output terminal, a gate of the third N-type transistor is configured for receiving the second control voltage, a source of the third N-type transistor is electrically connected to the low voltage.

10. A circuit system, comprising:
the oscillation circuit according to claim 1; and
a functional circuit electrically connected to the oscillation circuit and configured for performing a corresponding function based on the first oscillation signal of the oscillation circuit.

\* \* \* \* \*